(12) United States Patent
Brewer et al.

(10) Patent No.: US 7,301,773 B2
(45) Date of Patent: Nov. 27, 2007

(54) SEMI-COMPLIANT JOINING MECHANISM FOR SEMICONDUCTOR COOLING APPLICATIONS

(75) Inventors: Richard Grant Brewer, Newark, CA (US); Paul Tsao, Los Altos, CA (US); Richard Herms, Cupertino, CA (US); Mark Munch, Los Altos Hills, CA (US); Mark McMaster, Menlo Park, CA (US); Dave Corbin, Los Altos, CA (US)

(73) Assignee: Cooligy Inc., Mountain View, CA (US)

( * ) Notice: Subject to any disclaimer, the term of this patent is extended or adjusted under 35 U.S.C. 154(b) by 294 days.

(21) Appl. No.: 10/945,807

(22) Filed: Sep. 20, 2004

(65) Prior Publication Data

US 2005/0270742 A1    Dec. 8, 2005

Related U.S. Application Data (60) Provisional application No. 60/577,262, filed on Jun. 4, 2004.

(51) Int. Cl.
*H05K 7/20* (2006.01)
*F28F 7/00* (2006.01)
*H01L 23/34* (2006.01)

(52) U.S. Cl. ............ 361/719; 165/80.2; 165/185; 165/80.4; 361/696; 361/699; 257/719

(58) Field of Classification Search ............... 257/719
See application file for complete search history.

(56) References Cited

U.S. PATENT DOCUMENTS

| | | | |
|---|---|---|---|
| 3,320,351 A | 5/1967 | Glickman | |
| 3,509,430 A | 4/1970 | Mroz | |
| 3,874,549 A | 4/1975 | Hascoe | |
| 4,203,488 A | 5/1980 | Johnson et al. | |
| 4,235,285 A | 11/1980 | Johnson et al. | |
| 4,345,267 A | 8/1982 | Corman et al. | |
| 4,504,850 A * | 3/1985 | Pollard et al. | ............. 257/785 |
| 4,716,494 A | 12/1987 | Bright et al. | |
| 4,978,638 A | 12/1990 | Buller et al. | |
| 5,397,919 A | 3/1995 | Tata et al. | |
| 5,621,615 A | 4/1997 | Dawson et al. | |
| 5,672,980 A * | 9/1997 | Charlton et al. | ............. 324/755 |
| 5,830,806 A * | 11/1998 | Hudson et al. | ............. 438/690 |
| 5,882,248 A | 3/1999 | Wright et al. | ............... 451/285 |
| 5,886,870 A | 3/1999 | Omori | |
| 5,923,086 A | 7/1999 | Winer et al. | ................. 257/713 |

(Continued)

*Primary Examiner*—Gregory D Thompson
(74) *Attorney, Agent, or Firm*—Haverstock & Owens LLP (57) ABSTRACT

A heat collection apparatus is mounted to the heat source using a gimbal plate, which includes a gimbal joint. The gimbal joint enables application of a retaining force to the heat collection apparatus as a single-point load. The retaining force is applied along a vector that is collinear to the face-centered normal vector of the thermal interface of the heat source. This results in a balanced and centered application of the retaining force over the thermal interface area. The gimbal plate is mounted directly to a circuit board using spring means. The spring means regulate the amount of mating force directed through the gimbal joint to the heat collection device. Because the gimbal joint is rotation-compliant, the two mating faces making up the thermal interface are forced into a parallel mate. In this manner, a high performance TIM interface is generated.

33 Claims, 9 Drawing Sheets

U.S. PATENT DOCUMENTS

| | | | |
|---|---|---|---|
| 6,014,315 A | 1/2000 | McCullough et al. | |
| 6,021,045 A | 2/2000 | Johnson | |
| 6,058,014 A | 5/2000 | Choudhury et al. | 361/704 |
| 6,084,178 A | 7/2000 | Cromwell | |
| 6,116,331 A | 9/2000 | Tustaniwskyj et al. | 165/80.4 |
| 6,179,047 B1 | 1/2001 | Tustaniwskyj et al. | 165/80.4 |
| 6,196,299 B1 | 3/2001 | Tustaniwskyj et al. | 165/80.3 |
| 6,282,093 B1 * | 8/2001 | Goodwin | 361/704 |
| 6,347,036 B1 | 2/2002 | Yeager et al. | |
| 6,374,906 B1 | 4/2002 | Peterson et al. | 165/80.3 |
| 6,392,431 B1 | 5/2002 | Jones | 324/760 |
| 6,425,515 B2 | 7/2002 | Mays et al. | 228/103 |
| 6,449,157 B1 | 9/2002 | Chu | |
| 6,449,162 B1 | 9/2002 | Corbin, Jr. et al. | |
| 6,459,582 B1 | 10/2002 | Ali et al. | |
| 6,462,951 B2 | 10/2002 | Letourneau | 361/704 |
| 6,469,893 B1 * | 10/2002 | Frutschy et al. | 361/700 |
| 6,512,509 B1 | 1/2003 | McVicar | 345/161 |
| 6,699,791 B2 | 3/2004 | Hofmann et al. | 438/692 |
| 6,724,632 B2 | 4/2004 | Lee et al. | 361/719 |
| 6,741,470 B2 | 5/2004 | Isenburg | |
| 6,778,395 B1 | 8/2004 | Dong et al. | |
| 6,936,919 B2 | 8/2005 | Chuang et al. | |
| 6,977,816 B2 | 12/2005 | Lee et al. | 361/704 |
| 7,009,843 B2 | 3/2006 | Lee et al. | 361/704 |
| 2001/0006874 A1 | 7/2001 | Moore | 451/5 |
| 2004/0091311 A1 | 5/2004 | Lin | |
| 2004/0134639 A1 | 7/2004 | Franke et al. | |
| 2004/0139756 A1 | 7/2004 | Wall et al. | 62/230 |
| 2005/0140383 A1 | 6/2005 | Inoue et al. | 324/755 |
| 2005/0214173 A1 | 9/2005 | Facer et al. | 422/100 |
| 2006/0164807 A1 | 7/2006 | Reyzin et al. | 361/699 |

\* cited by examiner

Section A-A

SEMI-COMPLIANT JOINING MECHANISM FOR SEMICONDUCTOR COOLING APPLICATIONS

RELATED APPLICATION

This Patent Application claims priority under 35 U.S.C. 119 (e) of the co-pending U.S. Provisional Patent Application, Ser. No. 60/577,262 filed Jun. 4, 2004, and entitled "MULTIPLE COOLING TECHNIQUES ". The Provisional Patent Application Ser. No. 60/577,262 filed Jun. 4, 2004, and entitled "MULTIPLE COOLING TECHNIQUES" is also hereby incorporated by reference.

FIELD OF THE INVENTION

The invention relates to a method and apparatus for joining two interfaces. In particular, the invention relates to a semi-compliant joining mechanism used to join a heat collecting apparatus and a heat generating source in semiconductor cooling applications.

BACKGROUND OF THE INVENTION

As integrated circuits increase in size and complexity, dissipating the increasing amount of heat being generated by these integrated circuits is critical. As the high end for thermal solutions increases, so does the size of the cooling systems used to provide such thermal solutions. Unfortunately, larger cooling systems include more mass. Where a thermal interface is necessary, mounting such a cooling system becomes more challenging and often leads to damage of the cooling system or surrounding components, including the integrated circuit to be cooled.

Further, depending on the mounting configuration, the mass can act as a lever arm on the system, leading to partial or total separation of the heat collector and the integrated circuit at the thermal interface. Such conditions of non-uniformity at the thermal interface lead to degradation in the performance of the cooling system.

Certain applications provide only a limited space for cooling systems. In such space constrained applications, multiple component cooling systems are often integrated to minimize space. Such integrated cooling systems again result in higher mass, which when mounted to a heat source, can suffer from the same difficulties and problems described above.

There is therefore a need for a more effective mounting or joining mechanism to provide a thermal interface between a cooling system and a heat source.

SUMMARY OF THE INVENTION

In one aspect of the present invention, a joining system includes an integrated circuit mounted on a circuit board, a heat exchanger coupled to the integrated circuit, and a gimbal plate including a gimbal joint and a plurality of spring means, wherein the gimbal joint couples the gimbal plate to the heat exchanger, and the plurality of spring means couples the gimbal plate to the circuit board thereby coupling the heat exchanger to the integrated circuit. The joining system can also include a flexible fluid line coupled to the heat exchanger. The joining system can also include a mounting plate to retain the gimbal plate in position. The joining system can also include a heat rejector and a pump each coupled to the mounting plate and the flexible fluid line, thereby coupling the heat exchanger, the heat rejector, and the pump as an integrated cooling apparatus. The gimbal plate can substantially de-couple the mass of the heat rejector and the pump from the heat exchanger. The joining system can also include a heat rejector and a pump each remotely coupled to the heat exchanger via the flexible fluid line. The gimbal joint can comprise a single-point contact element directed outward from the gimbal plate. The single-point contact element can comprise a ball adhered to the gimbal plate, and the heat exchanger includes a receiving depression to mate to the ball. The single-point contact element can comprise a ball molded onto the gimbal plate, and the heat exchanger includes a receiving depression to mate to the ball. The heat exchanger can include a ball adhered to a top surface of the heat exchanger, and the gimbal joint comprises a receiving depression to mate to the ball. The heat exchanger can include a ball molded onto a top surface of the heat exchanger, and the gimbal joint comprises a receiving depression to mate to the ball. The heat exchanger can move independently from the gimbal plate. The heat exchanger can be coupled to the integrated circuit via a thermal interface. The spring means can enable a retaining force to be applied through the gimbal joint to the heat exchanger, thereby forcing the heat exchanger toward the integrated circuit to form the thermal interface. The gimbal joint can be coupled to the heat exchanger at a vector that is collinear to a face-centered normal vector of the integrated circuit. The gimbal joint can be rotation-compliant such that upon application of the retaining force a first mating surface of the heat exchanger is substantially parallel with a second mating surface of the integrated circuit. The spring means can regulate the retaining force applied to the integrated circuit by the heat exchanger. The spring means can include three or more sets of screws and springs. The spring means can include three or more spring plates.

In another aspect of the present invention, a joining system includes a heat generating device mounted to a mounting apparatus, a heat collector coupled to the heat producing device, and a gimbal plate including a gimbal joint and a plurality of spring means, wherein the gimbal joint couples the gimbal plate to the heat collector, and the plurality of spring means couples the gimbal plate to the mounting apparatus thereby coupling the heat collector to the heat generating device. The joining system can also include a flexible fluid line coupled to the heat collector. The joining system can also include a mounting plate coupled to the gimbal plate. The joining system can also include a heat rejector and a fluid pump each coupled to the mounting plate and the flexible fluid line, thereby coupling the heat collector, the heat rejector, and the pump as an integrated cooling apparatus. The joining system can also include a heat rejector and a pump each remotely coupled to the heat collector via the flexible fluid line. The spring means can enable a retaining force to be applied through the gimbal joint to the heat collector, thereby forcing the heat collector toward the heat generating device to form a thermal interface. The gimbal joint can be rotation-compliant such that upon application of the retaining force a first mating surface of the heat collector is substantially parallel with a second mating surface of the heat generating device.

In yet another aspect of the present invention, a joining apparatus includes a plurality of spring means, and a gimbal plate coupled to the plurality of spring means, the gimbal plate including a gimbal joint to provide a single-point contact element, wherein the gimbal joint is coupled to a first device and the plurality of spring means are coupled to a second device thereby maintaining an interface between the first device and the second device. The gimbal plate can also include a first surface including a recessed area. The gimbal joint can be configured within the recessed area. A shape of the recessed area can be configured to allow a second surface of the first device to fit within the recessed area and to inhibit the first device from moving laterally in relation to the gimbal plate. The spring means can regulate a retaining force applied by the gimbal joint. The spring means can include three or more sets of screws and springs. The spring means can include a plurality of spring plates.

In still yet another aspect of the present invention, a method mounts a cooling system to an integrated circuit. The method includes mounting the integrated circuit to a circuit board, coupling a gimbal plate to a heat exchanger using a gimbal joint, coupling the gimbal plate to the circuit board using a spring means, applying a retaining force to the heat exchanger through the gimbal joint by tightening the spring means, and generating a thermal interface between the heat exchanger and the integrated circuit through application of the retaining force on the heat exchanger. The method can also include coupling a flexible fluid line to the heat exchanger. The method can also include coupling a mounting plate to the gimbal plate. The method can also include mounting a heat rejector and a pump to the mounting plate and the flexible fluid line such that the heat rejector, the pump, and the heat exchanger form an integrated cooling apparatus. The method can also include coupling the flexible fluid line to remote heat rejector and a remote pump. Applying the retaining force to the heat exchanger through the gimbal joint can comprise applying the retaining force through a single-point of contact on the heat exchanger. The method can also include aligning a center of rotation of the gimbal joint with a face-centered normal vector of the integrated circuit, and applying the retaining force along a vector that is collinear with the face-centered normal vector of the integrated circuit.

DETAILED DESCRIPTION OF THE PRESENT INVENTION

Embodiments of the present invention include a semi-compliant joining mechanism used for generating repairable low thermal resistance interfaces between a heat collection apparatus and a heat generating source. The interfaces are preferably used in semiconductor cooling applications. The heat collection apparatus is preferably a micro-heat exchanger. As used herein, references to a heat collection apparatus, a heat collector, a micro-heat exchanger, a heat exchanger, and the like are used interchangeably and refer in general to any apparatus capable of exchanging heat with an external heat source. Also as used herein, references to a heat source, a heat generating source, a heat generating device, and the like, as well as specific references to exemplary heat generating devices such as an integrated circuit, an integrated microprocessor circuit, and a semiconductor heat source, are used interchangeably and refer in general to any apparatus or source capable of generating heat. The joining mechanism of the present invention is used to de-couple the heat collection apparatus from other components in a cooling system through a semi-compliant gimbal joint. The joining mechanism enables a robust, reliable, and re-workable heat transfer interface between the heat collection apparatus and a semiconductor heat source, such as an integrated microprocessor circuit.

Fluid lines and/or wires connecting the heat collection apparatus to remote components of the cooling system are made of compliant materials, thereby allowing the heat collection apparatus to move independently of said remote components. Such independent movement minimizes stress applied by any large mass components to the thermal interface during installation, shipping, and normal use of the cooling system. Stress to the thermal interface typically results in damage to the thermal interface which reduces the thermal performance of the heat collection apparatus.

The heat collection apparatus is preferably mounted to the heat source using a gimbal plate. The gimbal plate preferably includes a single-point contact feature, such as a ball, hemispherical surface, or point. The single-point contact feature joins with a mating feature on the heat collection apparatus. In an alternative embodiment, the heat collection apparatus includes the single-point contact feature and the gimbal plate includes the mating feature. The single-point contact feature and the mating feature are collectively referred to as a gimbal joint. The gimbal joint enables application of a retaining force to the heat collection apparatus as a single-point load. The retaining force is preferably applied along a vector that is collinear to the face-centered normal vector of the thermal interface of the heat source. This results in a balanced and centered application of the retaining force over the thermal interface area.

In the preferred embodiment, the heat source is an integrated circuit, and the integrated circuit is mounted to a circuit board. The gimbal plate is preferably mounted directly to the circuit board using spring means. Alternatively, the gimbal plate is mounted to the circuit board through an intermediate bracket attached to the circuit board. The spring means include a series of fasteners (screws), springs, and/or spring plates, which regulate the amount of mating force applied to the heat source by the heat collection apparatus at the thermal interface. In other words, the spring means regulates the amount of the retaining force directed through the gimbal joint to the heat collection device. As the fasteners on the gimbal plate are tightened, the retaining force is applied to the heat collection apparatus through the gimbal-joint, forcing the mating surfaces of the heat collection apparatus and the heat source together. Because the gimbal joint is rotation-compliant, the two mating faces making up the thermal interface are forced into a parallel mate. The two mating surfaces are unaffected by any asymmetry in the forces, such as the gravitational force of any other connected components of the cooling system, that are acting on the mounting hardware of the gimbal plate. In this manner, a Thermal Interface Material (TIM) interface, between the heat collection apparatus and the heat source, with high thermal performance and dimensional stability is generated. It will be appreciated that any commercially available TIM material can be used with the gimbal joint of the present invention.

Figure 1:
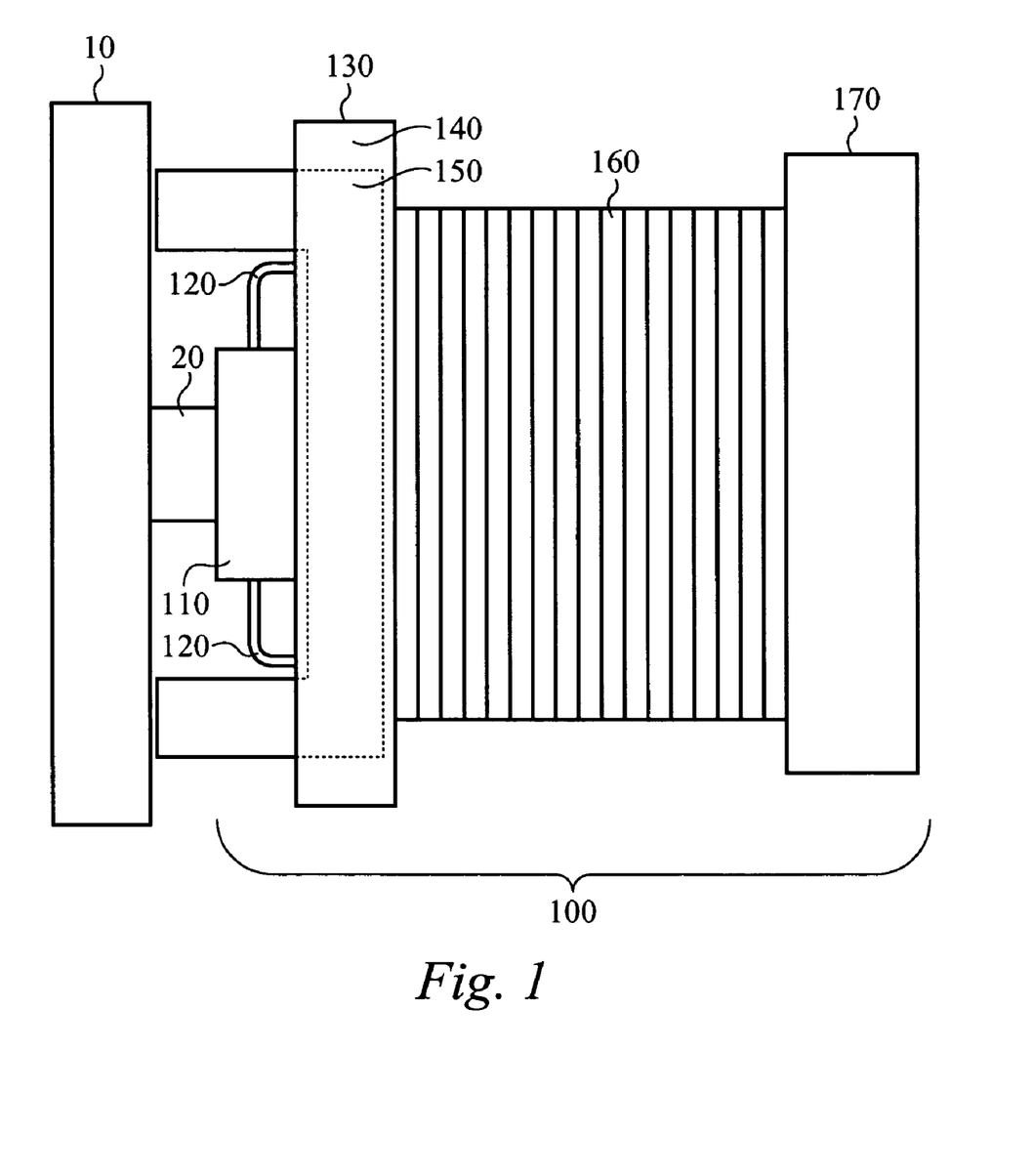
FIG. 1 illustrates a joining mechanism used to mount an integrated cooling system to a heat source according to the preferred embodiment of the present invention.

FIG. 1 illustrates a joining mechanism used to mount a cooling system to a heat source according to the preferred embodiment of the present invention. A cooling system 100 includes a micro-heat exchanger 110, a heat rejector 160, and a pump 170. The heat exchanger 110 is coupled to the heat rejector 160 and the pump 170 via fluid lines 120. The fluid lines 120 are preferably flexible. In the preferred embodiment, the cooling system 100 is an integrated system.

The cooling system 100 is used to cool a heat source. In the preferred embodiment, the heat source is an integrated circuit 20. The integrated circuit 20 is mounted to a circuit board 10. The circuit board 10 can be mounted directly to a chassis (not shown) or can be mounted to one or more other circuit boards, such as a mother board, which are in turn mounted to the chassis. The circuit board 10 is preferably mounted vertically, as shown in FIG. 1. Alternatively, the circuit board 10 is mounted horizontally, in which case the integrated circuit 20 and the cooling system 100 are positioned vertically on top of the horizontally mounted circuit board 10.

The heat rejector 160 and the pump 170 are secured to the heat exchanger 110 using a mounting mechanism 130. The mounting mechanism 130 includes a mounting plate 140 and a gimbal plate 150. The heat rejector 160 and the pump 170 are mounted to the mounting plate 140. The mounting plate 140 and the gimbal plate 150 are both mounted to the circuit board 10 independent of each other. There are no hard connections between the counting plate 140 and the gimbal plate 150. The gimbal plate 150 is positioned against the heat exchanger 110.

Figure 2:
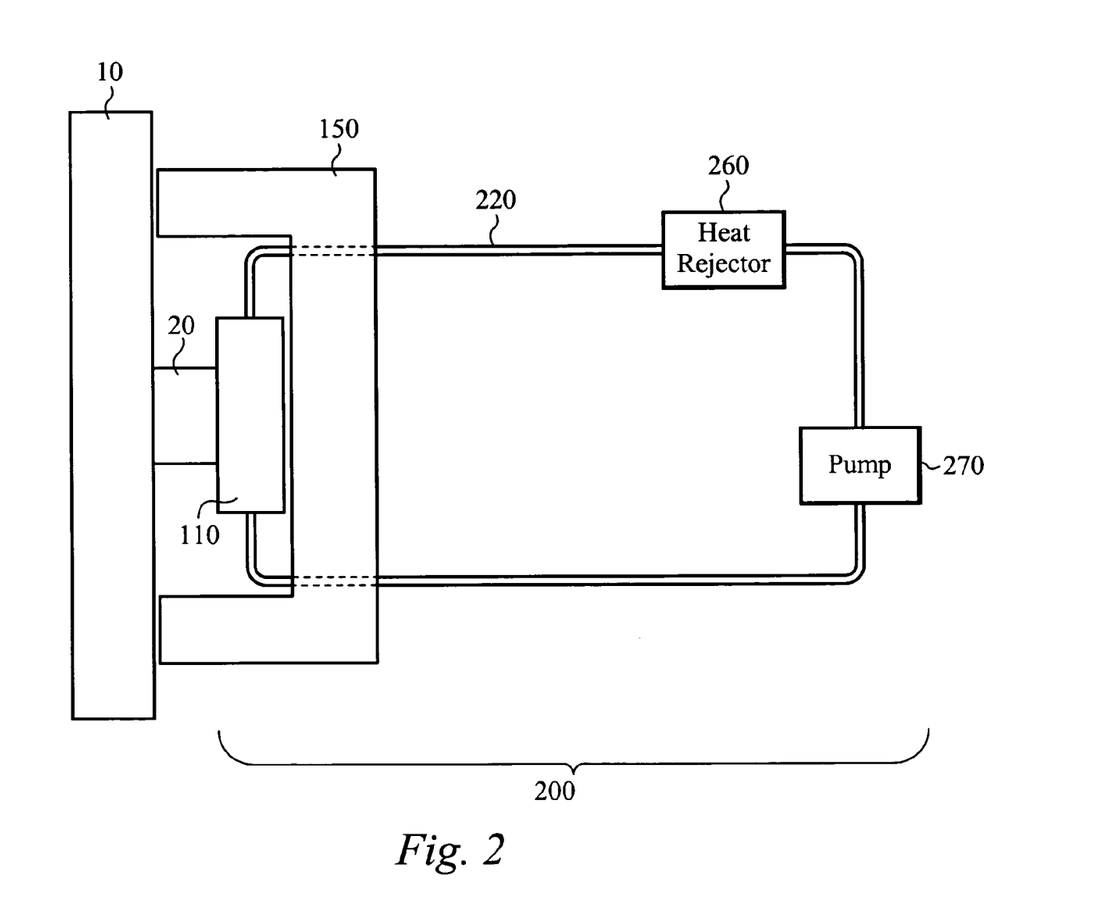
FIG. 2 illustrates a joining mechanism used to mount a heat exchanger to a heat source according to an alternative embodiment of the present invention.

FIG. 2 illustrates an alternative embodiment in which a cooling system includes a heat rejector 260 and a pump 270, both of which are remotely located from the heat exchanger 110. In this alternative embodiment, the cooling system 200 is not an integrated system, as is the case with cooling system 100 in FIG. 1. In the alternative embodiment, the gimbal plate 150 is positioned against the heat exchanger 110, and the gimbal plate 150 is also mounted to the circuit board 10. The heat exchanger 110 is coupled to the remote heat rejector 260 and the remote pump 270 via flexible fluid lines 220.

Figure 3:
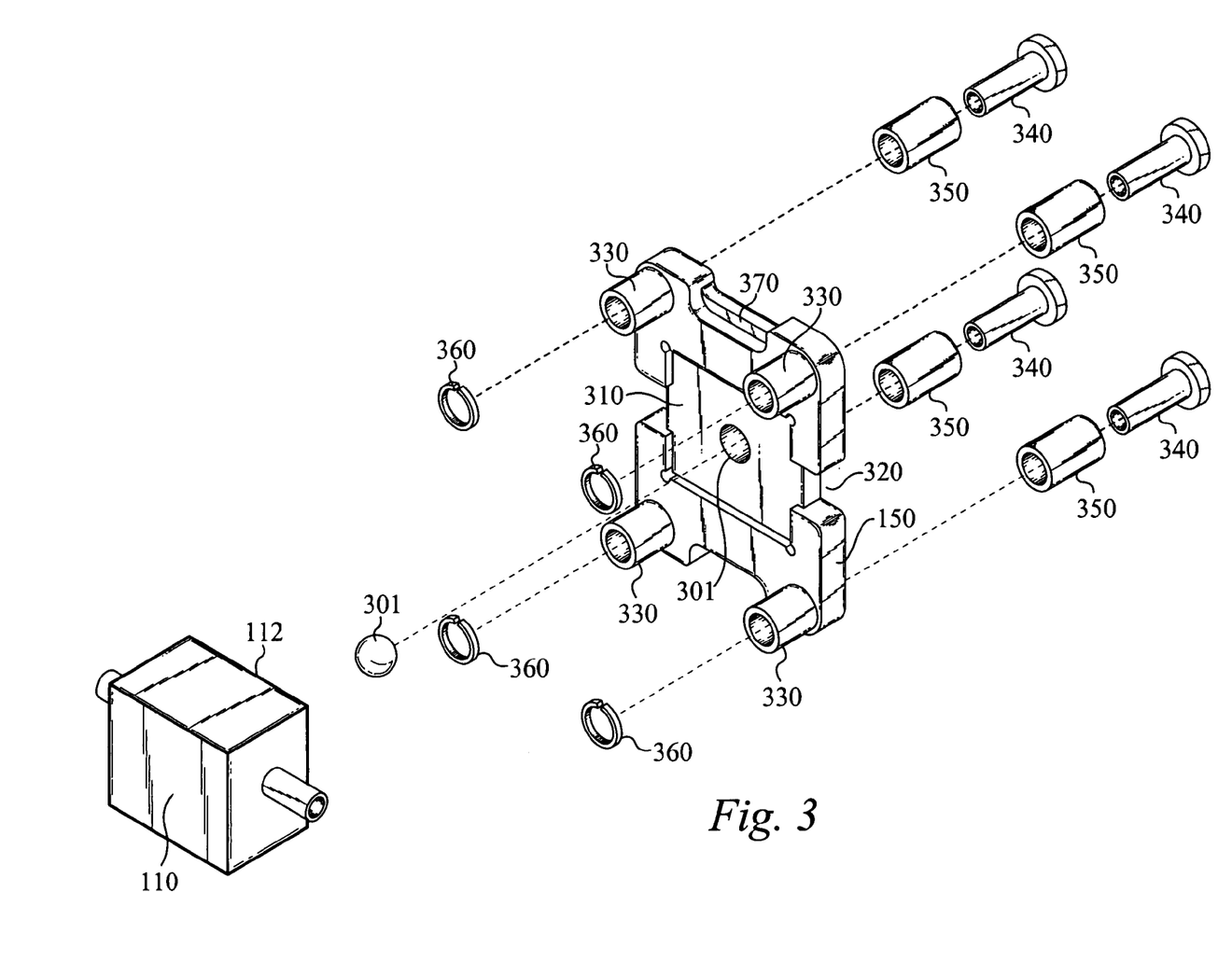
FIG. 3 illustrates an exploded view of the gimbal plate and the heat exchanger according to the preferred embodiment of the present invention.

FIG. 3 illustrates an exploded view of the gimbal plate 150 and the heat exchanger 110 according to the preferred embodiment of the present invention. The gimbal plate 150 includes a plurality of mounting stands 330. In the preferred embodiment, there are 4 mounting stands 300. The mounting stands 330 protrude from a bottom surface of the gimbal plate 150. Alternatively, the gimbal plate includes 3 or more mounting stands.

Figure 4A:
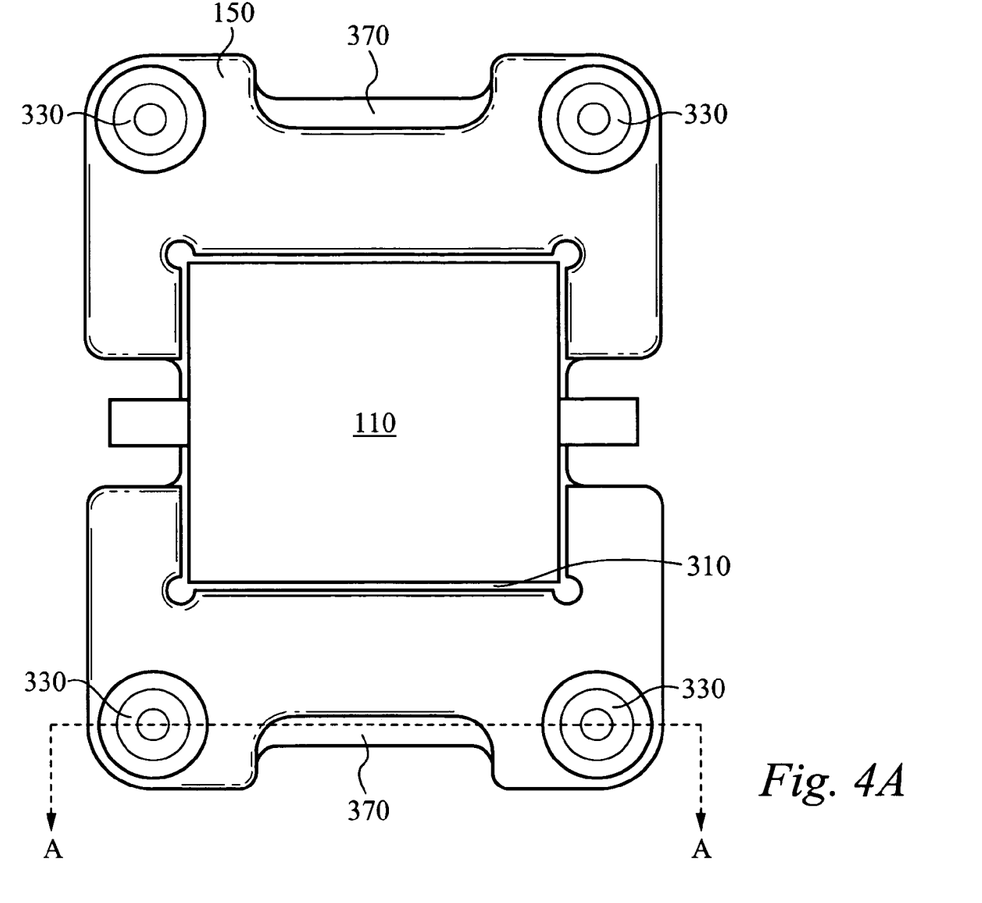
FIG. 4A illustrates a bottom up view of the gimbal plate in which the heat exchanger is positioned within the recessed area.

The gimbal plate 150 also includes a recessed area 310 cut into the bottom surface of the gimbal plate 150. The recessed area 310 is preferably configured according to the shape of a top surface of the heat exchanger 110. The shape of the recessed area 310 is slightly larger that the shape of the top surface of the heat exchanger 110 such that the top surface of the heat exchanger 110 can be inserted into the recessed area 310, and that the outer perimeter of the recessed area prevents the heat exchanger 110 from twisting or otherwise moving laterally in relation to the gimbal plate 150. FIG. 4A illustrates a bottom up view of the gimbal plate 150 in which the heat exchanger 110 is positioned within the recessed area 310.

Figure 7:
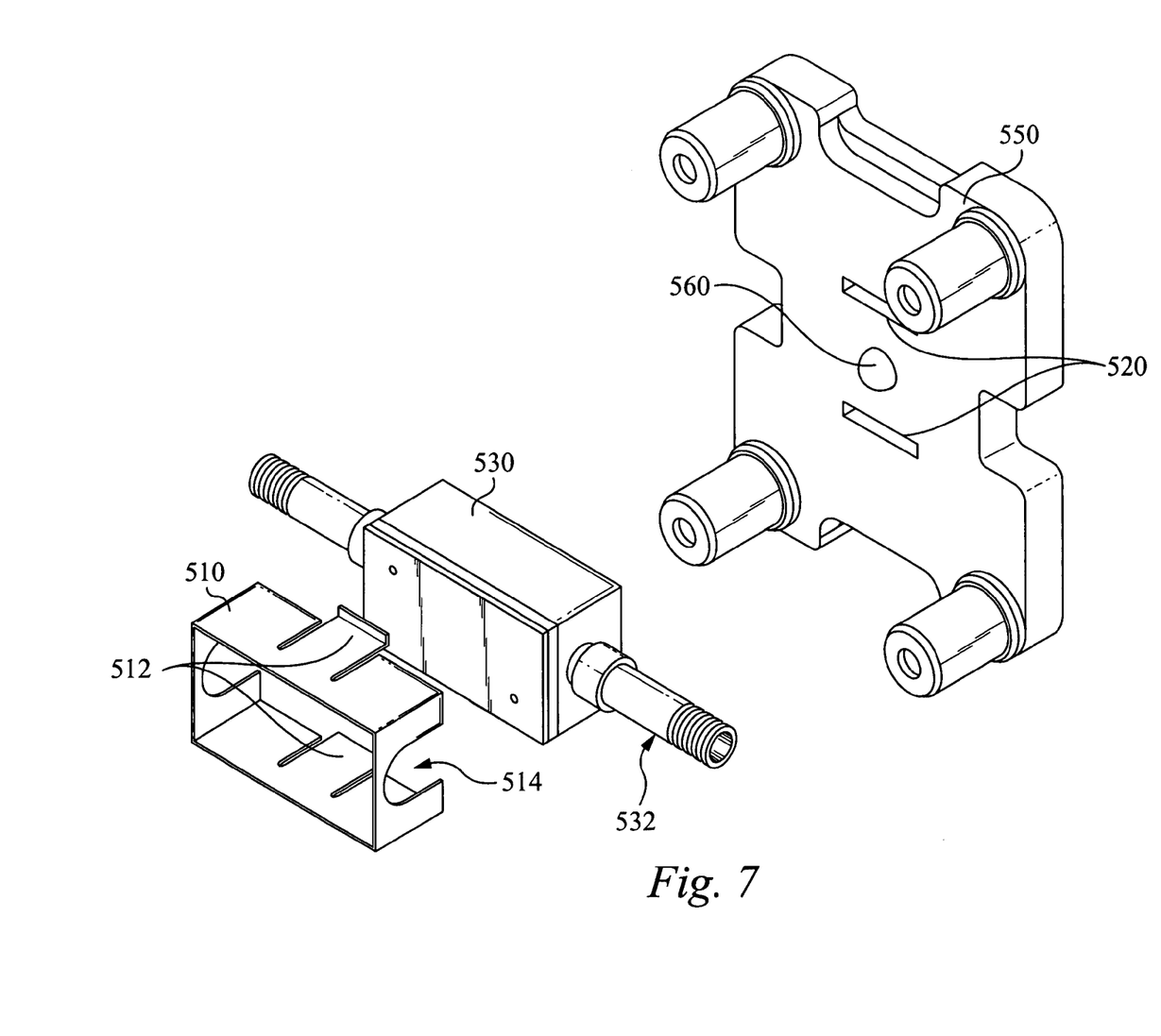
FIG. 7 illustrates an exploded view of an alternative gimbal plate, a heat exchanger, and a retaining clip.

In an alternative embodiment, a retaining clip is used to retain the heat exchanger in position against the gimbal joint. FIG. 7 illustrates an exploded view of an alternative gimbal plat, gimbal plate 550, and a retaining clip 510 for retaining the heat exchanger 110 in position. The gimbal plate 550 is identical to gimbal plate 150 (FIG. 3) with the exception that the recessed area 310 (FIG. 3) is replaced by retaining slots 520. The retaining clip 510 includes clip ears 512, which fit into retaining slots 520 on the gimbal plate 550. The retaining clip 510 provided sufficient clearance around the heat exchanger 530 so as not to interfere with functionality of the gimbal joint 560. The retaining clip 510 also includes apertures 514 to allow fluid lines 532 to connect with the heat exchanger 530. Positioning of the fluid lines 532 within the apertures 514 also acts to retain the heat exchanger 530 in position.

Figure 5A:
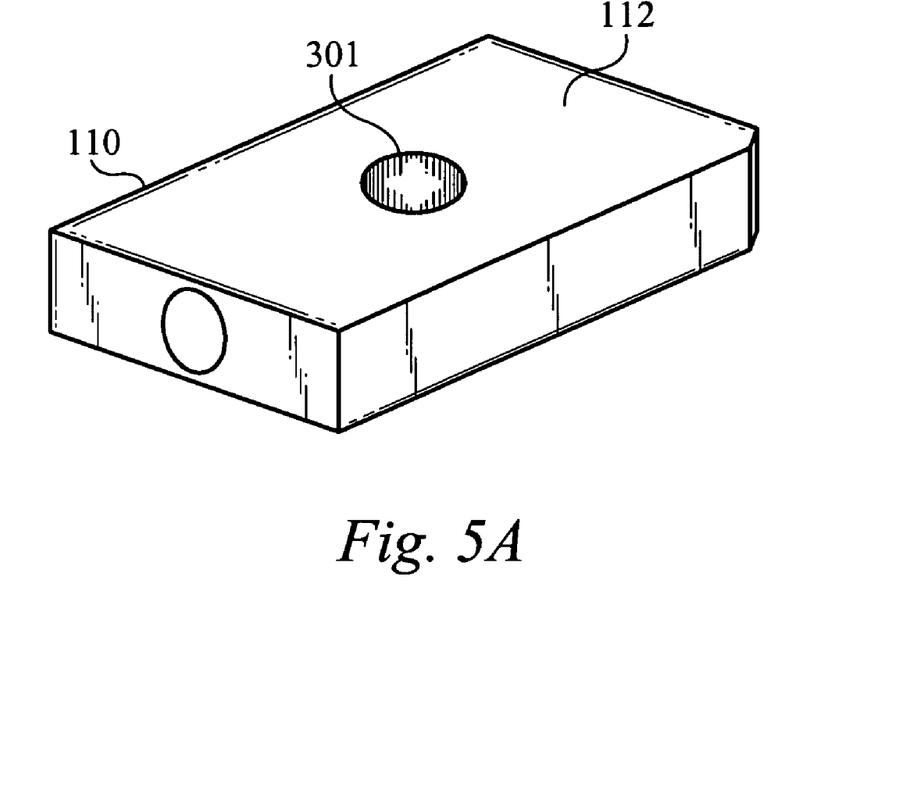
FIG. 5A illustrates a preferred gimbal joint feature on the top surface of the heat exchanger.
Figure 5B:
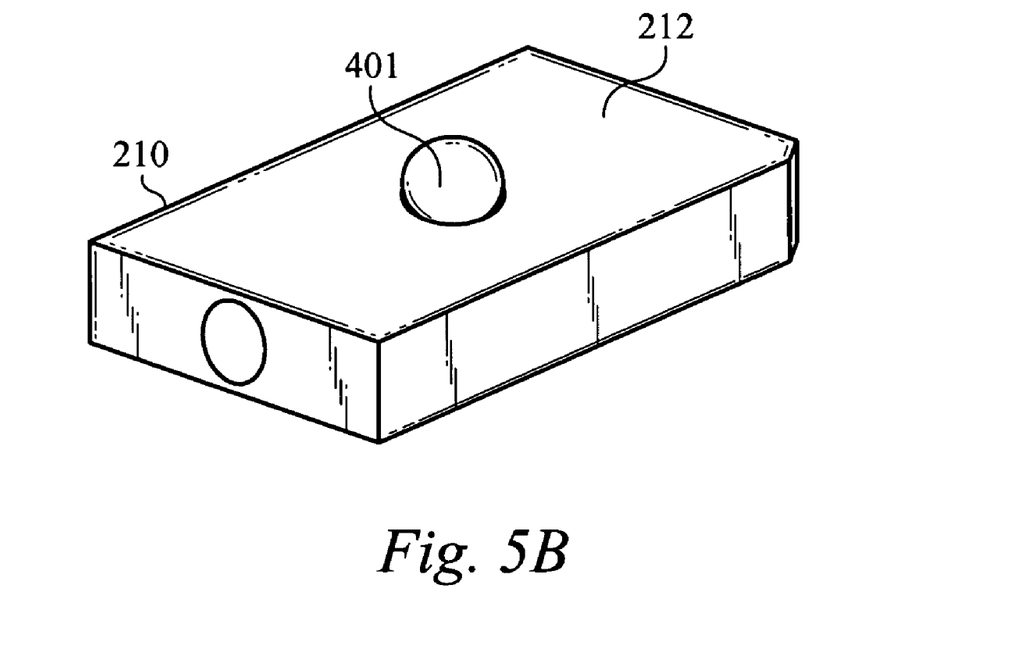
FIG. 5B illustrates an alternative gimbal joint feature on the top surface of the heat exchanger.

Referring back to FIG. 3, the gimbal plate 150 also includes a gimbal joint 301. The gimbal joint 301 is preferably positioned within the recessed area 310. The gimbal joint 301 is more preferably positioned at a geometric center position of the mounting stands 330. The gimbal joint 301 includes two mating components, a single-point contact and a receiver. Examples of the two mating components include, but are not limited to, a ball-in-socket, a hemispherical feature and a concave mating face, a free ball bearing between two concave hemispherical features, or a trapped ball bearing which mates with a concave hemispherical feature. In the preferred embodiment, the single-point contact is a ball such that the gimbal joint 301 includes the ball molded onto the bottom surface of the gimbal plate 150, and a concave receiving depression 301 (FIG. 5A) on a top surface 112 of the heat exchanger 110. Alternatively, the ball of the gimbal joint 301 can be adhered to the bottom surface of the gimbal plate 150 using solder, epoxy, or some other adhesive. Still alternatively, the single-point contact can be a point, provided the design of the heat exchanger is robust enough to survive the force provided through the point. The locations of the two mating components can also be reversed. That is, the top surface of the heat exchanger can include the single-point contact, such as a ball 401 secured to a top surface 212 of the heat exchanger 210 shown in FIG. 5B and a receiving depression in the bottom surface of the gimbal plate.

Referring to FIG. 3, the gimbal plate 150 includes spring means to mount the gimbal plate 150 to the circuit board 10 (FIG. 1) and to generate a retaining force which is to be directed through the gimbal joint 301 onto the heat exchanger 110. The spring means preferably includes springs 350, trapped plungers 340, and retainer rings 360. A set of one spring 350, one trapped plunger 340, and one retainer ring 360 is associated with each mounting stand 330. Spring 350 is positioned within mounting stand 330. Trapped plunger 340 fits within the spring 350 such that a bottom end of the trapped plunger 340 fits through a hole in the bottom of the mounting stand 330. The bottom end of the trapped plunger 340 is held in place by the retainer ring 360. A top end of the trapped plunger 340 is preferably a shoulder that rests on top of the spring 350.

Figure 4B:
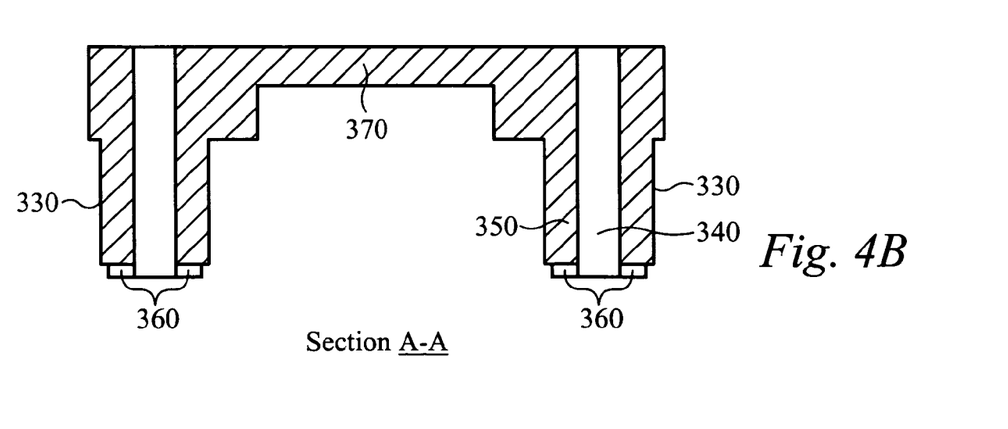
FIG. 4B illustrates a cross-sectional side view of the gimbal plate along the line A-A as shown in FIG. 4A.

FIG. 4B illustrates a cross-sectional side view of the gimbal plate 150 along the line A-A as shown in FIG. 4A. As shown in FIG. 4B, the spring 350 is positioned within the mounting stand 330, and the trapped plunger 340 is positioned within the spring 350. The bottom end of the trapped plunger 340 extends through the hole in the bottom of the mounting stand 330, and the bottom end is held in place by the retainer ring 360. FIG. 4B also shows the shoulder of the trapped plunger 340 pressing against the spring 350.

Figure 4C:
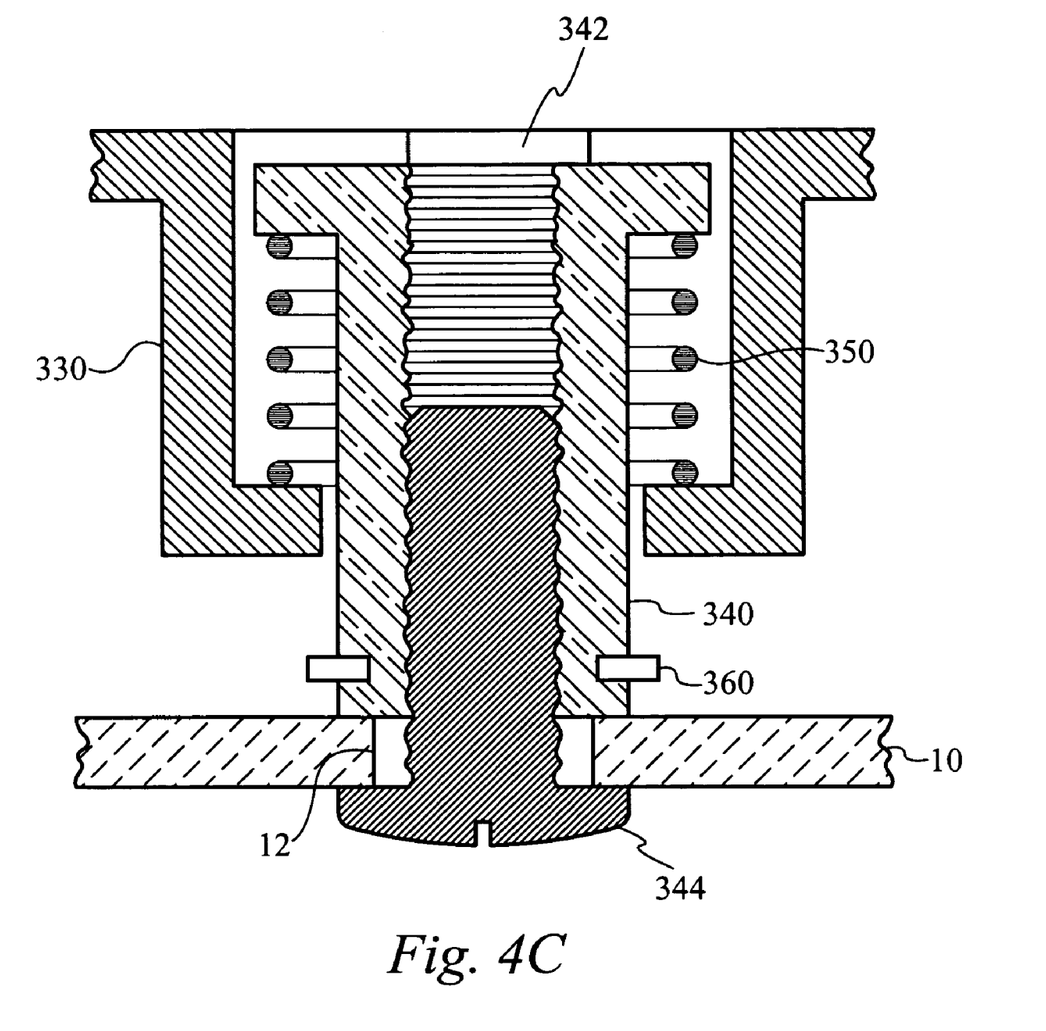
FIG. 4C illustrates a cross-sectional view of a preferred configuration for coupling each mounting stand to the circuit board.
Figure 4D:
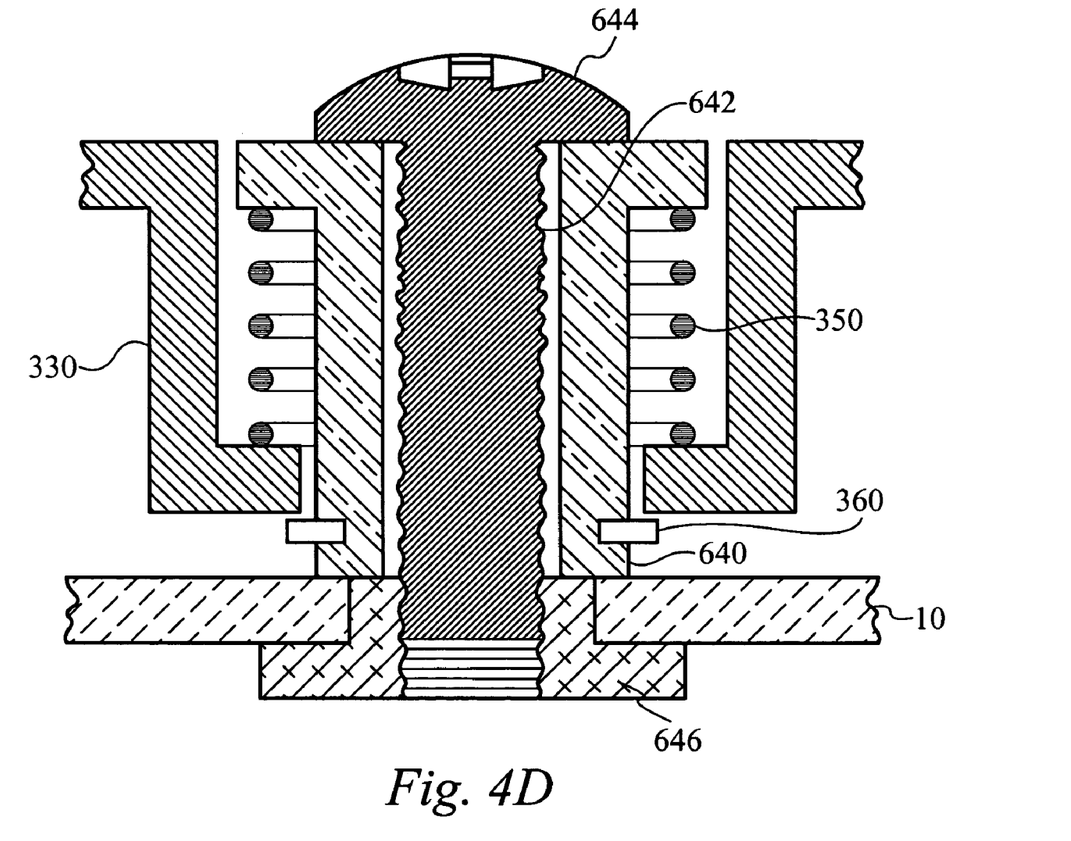
FIG. 4D illustrates a cross-sectional view of an alternative configuration for coupling each mounting stand to the circuit board.

FIG. 4C illustrates a cross-sectional view of a preferred configuration for coupling each mounting stand 330 to the circuit board 10. The trapper plunger 340 is preferably internally threaded to accept a screw 344. The screw 344 preferably passes through a clearance aperture 12 in the circuit board 10 and mates with the threads of the trapped plunger 340. As the screw 344 is tightened, the trapped plunger 344 contracts the spring 350, thereby generating a retaining force that is applied through the gimbal joint 301 (FIG. 3). Preferably, each of the trapped plungers 340 include a key 342 to prevent rotation, allowing for one-tool installation from the back FIG. 4D illustrates a cross-sectional view of an alternative configuration for coupling each mounting stand 330 to the circuit board 10. A trapped plunger 640 includes a clearance aperture 642 through which a screw 644 is placed. The clearance aperture 642 is not threaded. The screw 644 mates with a threaded back-side plate 646 on the circuit board 10. The threaded back-side plate 646 can also be a thread nut or a threaded insert. A top of the screw 644 presses against the trapped plunger 640. Upon tightening the screw 644, downward pressure is applied to the trapped plunger 640, which contracts the spring 350. Contraction of the spring 350 generates the retaining force. The alternative configuration enables installation of the gimbal plate 150 (FIG. 3) from the front-side of the circuit board 10.

Preferably, each set of trapped plunger 340 and spring 350 contribute equally to the overall retaining force applied to the gimbal joint 301. The retaining force is regulated by the amount of thread on the trapped plunger 340 when the threads are fully engaged, and by the spring force of the spring 350. The spring 350 can be any type of spring, such as polymer, coil, or wavy. In this manner, a controlled amount of retaining force is provided between the heat exchanger 110 and the integrated circuit 20. However, the circuit board 10 acts as a limiter such that over tightening does not lead to excess retaining force being applied to the heat exchanger 110. Such a fail safe prevents damage to the heat exchanger 110 or the integrated circuit 20.

The gimbal plate 150 also includes gaps 320 to improve access for the flexible fluid lines 120 (FIG. 1) to the heat exchanger 110. Tabs 370 are positioned on opposite sides of the gimbal plate 150. The tabs 370 are used to couple the gimbal plate 150 to the mounting plate 140 (FIG. 1).

A method of coupling the gimbal plate 150 to the integrated circuit 20 is now described in relation to FIG. 3. The single point contact of the gimbal joint 301 on the bottom surface of the gimbal plate 150 is placed against the receiving depression of the gimbal joint 301 on the top surface of the heat exchanger 110. A bottom surface of the heat exchanger 110 is placed against a top surface of the integrated circuit 20. Due to the rotational-compliance of the gimbal joint 301, as the heat exchanger 110 is brought into contact with the integrated circuit 20, the gimbal joint 301 enables the bottom surface of the heat exchanger 110 to move into a substantially parallel alignment with the top surface of the integrated circuit 20. Additionally, the integrated circuit 20 and the heat exchanger 110 each has a specific surface area. To cause the mating surfaces of the heat exchanger 110 and the integrated circuit 20 to be presented effectively, a center of rotation of the receiving depression on the heat exchanger 110 is positioned to be collinear with the face-centered normal of the integrated circuit 20. The receiving depression on the heat exchanger 110 is also positioned to be collinear with the face-centered normal of the interface surface of the heat exchanger 110.

Each of the trapped plungers 340 are screwed into the circuit board 10 (FIG. 1), thereby pushing the shoulder of each trapped plunger 340 against the spring 350 within the mounting stand 330. The combined resulting force from each of the trapped plungers 340 being screwed into the circuit board 10 generates a retaining force directed through the gimbal joint 301 to the heat exchanger 110. Since the center of rotation of the gimbal joint 301 is collinear with the face-centered normal lines of both the heat exchanger 110 and the integrated circuit 20, the retaining force is applied normal to the face of the integrated circuit 20. The retaining force moves the bottom surface of the heat exchanger 110 against the top surface of the integrated circuit 20 to form a thermal interface. As the gimbal's center of rotation is collinear to the face-centered normal of the integrated circuit 20, a symmetric, even distribution of force is guaranteed at the thermal interface, causing the bottom surface of heat exchanger 110 to be properly presented to the top surface of the integrated circuit 20.

Figure 6A:
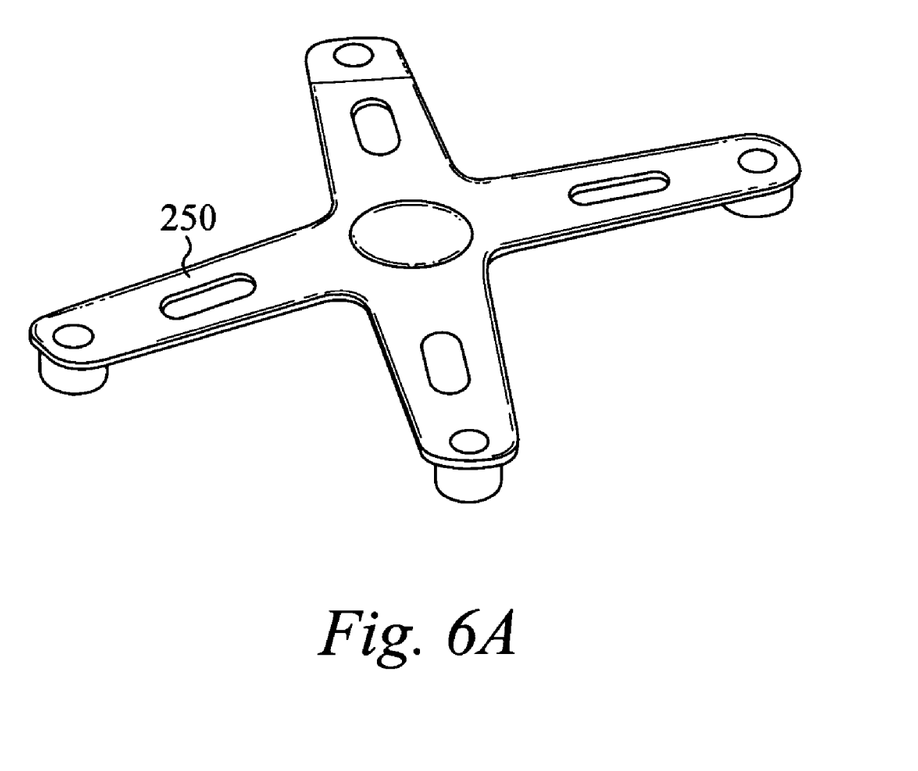
FIG. 6A illustrates a first alternative embodiment of the gimbal plate of the present invention.
Figure 6B:
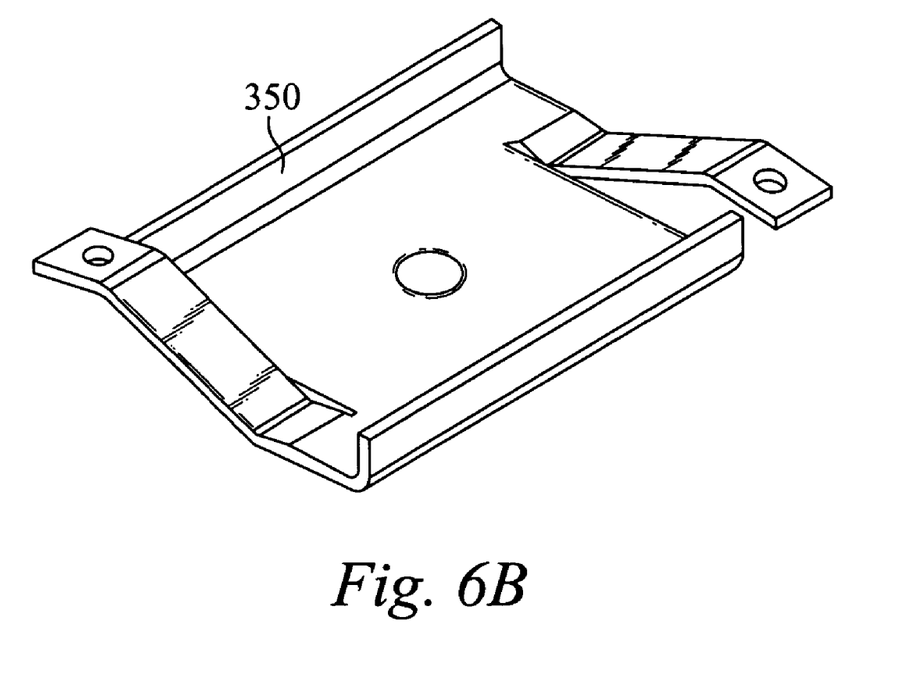
FIG. 6B illustrates a second alternative embodiment of the gimbal plate of the present invention.

FIG. 6A illustrates a first alternative embodiment of the gimbal plate of the present invention. In the first alternative embodiment, a gimbal plate 250 is constructed using a stamped piece of metal, or other material, having threaded inserts or clearance holes for partially threaded screws. The gimbal plate 250 is configured as a four pronged star, where the material is semi-compliant and acts as the spring means. FIG. 6B illustrates a second alternative embodiment of the gimbal plate of the present invention. In the second alternative embodiment, a gimbal plate 350 is also constructed using a stamped piece of metal, or other material, having threaded inserts or clearance holes for partially threaded screws. The gimbal plate 350 is configured as a plate with flexible portions on either end. The gimbal plate 350 is secured to a circuit board at the flexible ends.

The joining mechanism of the present invention provides numerous advantages. First, the joining mechanism provides even and uniform loading with guaranteed parallelism between the heat source and the heat collection apparatus. Second, the joining mechanism provides even and uniform TIM lines with high repeatability. Third, the joining mechanism enables the heat collection apparatus to be remounted several times without the need for resurfacing the thermal interface area. Fourth, the joining mechanism poses a lower risk of damage to the heat source or the heat collection apparatus during assembly when compared to rigid, non-compliant systems. Fifth, the joining mechanism reduces the potential for TIM-related cooling system failures during assembly, shipping, and normal use. It is understood that other advantages are provided by the joining mechanism of the present invention.

Although the mounting plate is described as coupling to a single gimbal plate, it is understood that multiple gimbal plates can be coupled to a single mounting plate. It is also understood that multiple integrated circuits, and therefore multiple heat collecting apparatuses and multiple gimbal plates, can be included on a single circuit board.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed:

1. A joining system comprising:
   a. an integrated circuit mounted on a circuit board;
   b. a heat exchanger coupled to the integrated circuit; and
   c. a gimbal plate including a gimbal joint and a plurality of spring means, wherein the gimbal joint couples the gimbal plate to the heat exchanger and the gimbal joint is configured to be rotationally-compliant such that an application vector of a retaining force applied by the plurality of spring means is adaptively directed to a thermal interface surface of the integrated circuit, and the plurality of spring means couples the gimbal plate to the circuit board thereby coupling the heat exchanger to the integrated circuit.

2. The joining system of claim 1 further comprising a flexible fluid line coupled to the heat exchanger.

3. The joining system of claim 2 further comprising a mounting plate to couple a heat rejector to the gimbal plate.

4. The joining system of claim 3 further comprising the heat rejector and a pump each coupled to the mounting plate and the flexible fluid line, thereby coupling the heat exchanger, the heat rejector, and the pump as an integrated cooling apparatus.

5. The joining system of claim 4 wherein the gimbal plate substantially de-couples the mass of the heat rejector and the pump from the heat exchanger.

6. The joining system of claim 3 further comprising the heat rejector and a pump each remotely coupled to the heat exchanger via the flexible fluid line.

7. The joining system of claim 1 wherein the gimbal joint comprises a single-point contact element directed outward from the gimbal plate.

8. The joining system of claim 7 wherein the single-point contact element comprises a ball adhered to the gimbal plate, and the heat exchanger includes a receiving depression to mate to the ball.

9. The joining system of claim 7 wherein the single-point contact element comprises a ball molded onto the gimbal plate, and the heat exchanger includes a receiving depression to mate to the ball.

10. The joining system of claim 1 wherein the heat exchanger includes a ball adhered to a top surface of the heat exchanger, and the gimbal joint comprises a receiving depression to mate to the ball.

11. The joining system of claim 1 wherein the heat exchanger includes a ball molded onto a top surface of the heat exchanger, and the gimbal joint comprises a receiving depression to mate to the ball.

12. The joining system of claim 1 wherein the heat exchanger is configured to move independently from the gimbal plate.

13. The joining system of claim 1 wherein the heat exchanger is coupled to the integrated circuit via a thermal interface.

14. The joining system of claim 13 wherein the spring means is configured to enable the retaining force to be applied through the gimbal joint to the heat exchanger, thereby forcing the heat exchanger toward the integrated circuit to form the thermal interface.

15. The joining system of claim 14 wherein a center of rotation of the gimbal joint is collinear with a face-centered normal vector of the integrated circuit.

16. The joining system of claim 15 wherein the gimbal joint, upon application of the retaining force a first mating surface of the heat exchanger is substantially parallel with a second mating surface of the integrated circuit.

17. The joining system of claim 14 wherein the spring means is configured to regulate the retaining force applied to the integrated circuit by the heat exchanger.

18. The joining system of claim 1 wherein the spring means includes three or more sets of screws and springs.

19. The joining system of claim 1 wherein the spring means includes three or more spring plates.

20. A joining system comprising:
   a. a heat generating device mounted to a mounting apparatus;
   b. a heat exchanger coupled to the heat generating device; and
   c. a gimbal plate including a gimbal joint and a plurality of spring means, wherein the gimbal joint couples the gimbal plate to the heat exchanger and the gimbal joint is configured to be rotationally-compliant such that an application vector of a retaining force applied by the plurality of spring means is adaptively directed to a thermal interface surface of the heat generating device, and the plurality of spring means couples the gimbal plate to the mounting apparatus thereby coupling the heat exchanger to the heat generating device.

21. The joining system of claim 20 further comprising a flexible fluid line coupled to the heat exchanger.

22. The joining system of claim 21 further comprising a mounting plate coupled to the gimbal plate.

23. The joining system of claim 22 further comprising a heat rejector and a fluid pump each coupled to the mounting plate and the flexible fluid line, thereby coupling the heat exchanger, the heat rejector, and the pump as an integrated cooling apparatus.

24. The joining system of claim 21 further comprising a heat rejector and a pump each remotely coupled to the heat exchanger via the flexible fluid line.

25. The joining system of claim 20 wherein the spring means is configured to enable the retaining force to be applied through the gimbal joint to the heat exchanger, thereby forcing the heat exchanger toward the heat generating device to form a thermal interface.

26. The joining system of claim 25 wherein the application vector is adaptively directed such that upon application of the retaining force a first mating surface of the heat exchanger is substantially parallel with a second mating surface of the heat generating device.

27. A joining apparatus comprising:
   a. a plurality of spring means; and
   b. a gimbal plate coupled to the plurality of spring means, the gimbal plate including a gimbal joint to provide a single-point contact element, wherein the gimbal joint is coupled to a first device and the plurality of spring means are coupled to a second device thereby maintaining an interface between the first device and the second device, further wherein the gimbal joint is configured to be rotationally-compliant such that an application vector of a retaining force applied by the plurality of spring means is adaptively directed to the first device.

28. The joining apparatus of claim 27 wherein the gimbal plate further comprises a first surface including a recessed area.

29. The joining apparatus of claim 28 wherein the gimbal joint is configured within the recessed area.

30. The joining apparatus of claim 29 wherein a shape of the recessed area is configured to allow a second surface of the first device to fit within the recessed area and to inhibit the first device from moving laterally in relation to the gimbal plate.

31. The joining apparatus of claim 27 wherein the spring means is configured to regulate the retaining force applied by the gimbal joint.

32. The joining apparatus of claim 27 wherein the spring means includes three or more sets of screws and springs.

33. The joining apparatus of claim 27 wherein the spring means includes a plurality of spring plates.

* * * * *